United States Patent Office 3,261,983
Patented July 19, 1966

3,261,983
TRANSISTOR SWITCH EMPLOYING DIODES FOR VOLTAGE PROTECTION

Takao Miki, Himeji, Japan, assignor to Mitsubishi Denki Kabushiki-Kaisha, Tokyo, Japan, a corporation of Japan Filed Feb. 21, 1961, Ser. No. 90,693
Claims priority, application Japan, Feb. 26, 1960, 35/6,249
7 Claims. (Cl. 307—88.5)

Figure 1:
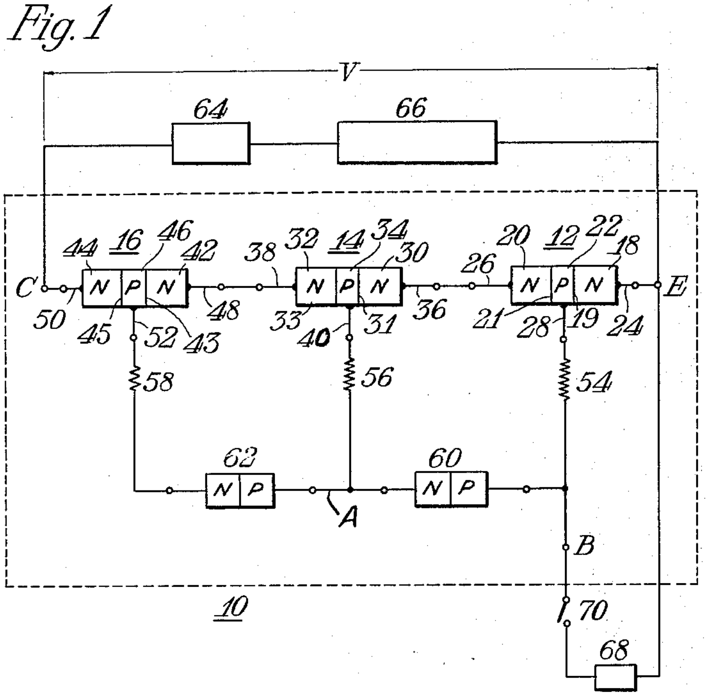

This invention relates generally to a transistor device and more particularly to a transistor switch device suitable for use with a high voltage circuit or a high inductance circuit.

In any junction transistor comprising two semi-conductive regions of one semiconductivity separated from each other by an intermediate semiconductive region of another semiconductivity, conduction from one to the other of the two regions is controllable by a very low current flowing forwardly through the intermediate region. In other words, upon interrupting the forward current flowing through the intermediate semiconductive region of the transistor, the junction formed between the same and the one or the other of the first two semiconductive regions performs a rectifying operation for preventing the flow of current through the two semiconductive regions. This rectifying operation is equivalent to that provided by any conventional semiconductor diode rectifier. More specially, the junction formed between a semiconductive region of P type semiconductivity and a semiconductive region of N type semiconductivity permits a current to flow from the P type to the N type region but exhibits an extremely high resistance to the flow of a reverse current whereby only a very low leakage current will be permitted to flow from the N type to the P type region. However, if the junction will include applied thereacross a voltage exceeding the critical voltage well known as the Zener voltage the same can not prevent the flow of the abovementioned reverse current. The leakage current is abruptly increased at the critical voltage applied across the junction. On the other hand, when a predetermined forward current flows through the intermediate region of the transistor as above described, the transistor will become highly conductive.

If the forward current is prevented from flowing through the intermediate semiconductive region of the transistor thus caused to be conductive then the transistor is abruptly caused to be operatively converted into a semiconductor diode in blocking state. Thus the transistor including applied thereto a blocking voltage below the Zener voltage inherent to said diode can interrupt a flow of relatively high current with a substantially low leakage current permitted to flow through the transistor. Therefore, a transistor of the type described can be effectively used as a circuit interrupter having a relatively high current rating.

However, with such a transistor connected in an especially high voltage circuit or a high inductance circuit or the like, the interruption of the circuit will cause a relatively high transient voltage to be developed in the circuit and hence across the transistor. If the transient voltage thus developed will exceed the Zener voltage of the equivalent semiconductor diode the transistor can not perform its rectifying operation and a high leakage current will flow through the transistor. Consequently, the transistor will be not only incapable of serving as a circuit interrupter but also may be damaged.

An object of the invention is to provide a new and improved transistor switch device which responds to small control currents to effect closing and opening of a high voltage circuit or a high inductance circuit with the flow of leakage current through the device maintained low during opening of the circuit.

Another object of the invention is to provide a transistor switch device comprising a plurality of serially connected transistors and acting as a single transistor having a high breakdown voltage.

A further object of the invention is to provide a transistor switch device comprising a plurality of serially connected transistors and protected against a high blocking voltage induced therein upon blocking the same by reducing that portion of the blocking voltage imposed on each of the transistors to a value below the Zener voltage of the equivalent diode.

In order to accomplish those objects and according to the teaching of the invention, there is provided a transistor switch device comprising a first transistor, and a second transistor including an emitter electrode connected to the collector electrode of said first transistor, said second transistor including a base electrode connected to the base electrode of said first transistor through a semiconductor diode operative not to prevent a base current from flowing through said second transistor. If desired, one or more transistors may be connected in circuit relationship with the abovementioned transistors in the same manner. An auxiliary or control source of electric current may be connected across a point between the base electrode of the first transistor and the semiconductor diode and the emitter electrode of the same for providing simultaneously the forward base current to all the transistors to thereby control the operation of the same.

Figure 2:
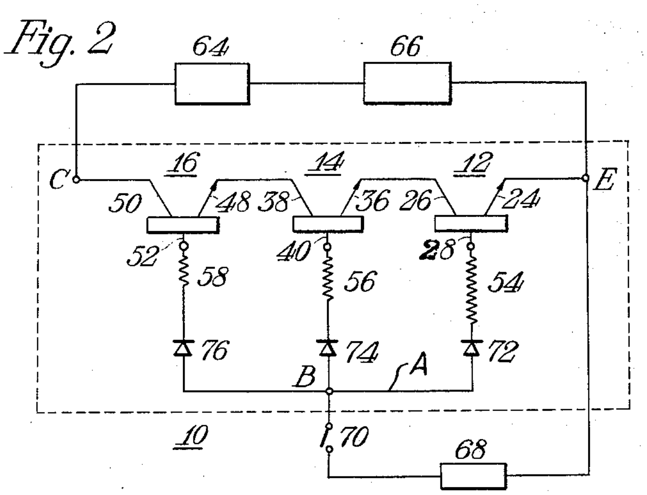

The invention will become more readily apparent from the following detailed description taken in conjunction with the accompanying drawings in which:

FIG. 1 shows schematically a circuit diagram of a transistor switch device constructed according to the teaching of the invention; and FIG. 2 shows schematically a circuit diagram of another transistor switch device according to the invention.

Referring now to FIG. 1 of the drawings, there is illustrated a transistor switch device constructed according to the invention. The transistor switch device enclosed within the dotted block 10 is shown as comprising three transistors of N–P–N junction type designated generally 12, 14 and 16 respectively. The first transistor 12 includes two semiconductive regions of N type semiconductivity 18 and 20 separated from each other by an intermediate semiconductive region of P type semiconductivity 22 with P–N junctions 19 and 21 formed between the P type region 22 and the N type region 18 and between the P type region 22 and the N type region 20 respectively. The transistor 12 also includes an emitter electrode 24 in ohmic contact with the first N type region 18, a collector electrode 26 in ohmic contact with the second N type region 20, and a base electrode 28 in ohmic contact with the intermediate P type region 22. Similarly, the second transistor 14 includes two semiconductive regions of N type semiconductivity 30 and 32 separated from each other by an intermediate region of P type semiconductivity 34 with P–N junctions 31 and 33 formed between the P type region 34 and the N type region 30 and between the P type region 34 and the N type region 32 respectively. The first and second N type regions 30 and 32 respectively of the transistor 14 include an emitter electrode 36 and a collector electrode 38 in ohmic contact therewith respectively, while the P type region 34 includes a base electrode 40 in ohmic contact therewith. The third transistor 16 includes a first semiconductive region of N type semiconductivity 42 including an emitter electrode 48 in ohmic contact therewith, a second semiconductive region of N type semiconductivity 44 including a collector electrode 50 in ohmic contact therewith, and an intermediate semiconductive region of P type semiconductivity 46 separating the first N type region 42 from the second N type region 44 with P–N junctions 43 and 45 formed between the P type region 46 and the N type region 42 and between the P type region 46 and the N type region 44 respectively. A base electrode 52 is in ohmic contact with the P type intermediate region 46 of the transistor 16.

The transistors 12, 14 and 16 are arranged in series cascade with the collector electrode 26 of the first transistor 12 connected to the emitter electrode 36 of the second transistor 14 and with the collector electrode 38 of the latter transistor connected to the emitter electrode 48 of the third (or the last in the instant case) transistor 16. Thus the emitter-to-collector circuits of the transistors 12, 14 and 16 are connected in series cascade circuit relationship to each other with a predetermined common polarity. Further the emitter electrode 24 of the first transistor 12 is connected to a terminal forming the emitter terminal E of the transistor switch device 10 while the collector electrode 50 of the third transistor 16 is connected to another terminal forming the collector terminal C of the device.

The base electrodes of all of the transistors in the series are connected to a common control line A which in turn is connected to the base terminal B of the transistor switch device 10. The base electrode 28 of the first transistor 12 is connected to the common control line A through a current-limiting resistor 54. The base electrode 40 of the second transistor 14 is connected to the common control line A through a current-limiting resistor 56 and a semiconductor diode 60 is included in the connecting circuit this provided between the base electrodes of the transistors 12 and 14 and is operative to prevent a base current from inversely flowing through the transistor 14 from either of the N type regions to the P type region. Similarly, the base electrode 52 of the third transistor 16 is connected to the common control line A through a current-limiting resistor 58. A semiconductor diode 62 is operative to prevent the inverse flow of base current through the transistor 16.

Across the collector and emitter terminals C and E respectively of the transistor switch device 10 a power source of direct current 64 is connected in series circuit relationship to a load 66.

In order to control the operation of the transistor switch device 10, an auxiliary or control source of electric current 68 is connected in series to a manually operated switch 70 across the emitter and base terminals E and B respectively of the device.

The device described above is operated as follows: It is now assumed that the switch 70 is manually closed. This completes a circuit from the control source 68 through the now closed switch 70, the base terminal B, the resistor 54, the base electrode 28 of the transistor 12, the P type region 22, the junction 19, the N type region 18, the emitter electrode 24 and the emitter terminal E back to the source. Therefore, a base current will be conducted through the P type region 22, the junction 19 and the N type region 18 of the transistor 12. As previously pointed out, this flow of the base current causes the collector-to-emitter circuit of the transistor 12 to be conductive. The magnitude of the base current or control current is preferably selected such that the transistor 12 will become highly conductive for the reason that will be apparent hereinafter.

The conducting transistor 12 will electrically connect the emitter electrode 36 of the transistor 14 to the control source 68. Then a current from the source 68 can flow through the switch 70, the semiconductor diode 60, the resistor 56, the base electrode 40 of the transistor 14, the P type region 34, the junction 31, the N type region 30, the emitter electrode 36, the conducting transistor 12 and the emitter terminal E back to the source. As with the transistor 12, the transistor 14 becomes conductive. That is, the collector electrode 38 of the transistor 14 is electrically connected to the emitter electrode 36 thereof.

Due to the conduction of the transistors 12 and 14, the control source 68 will now supply a base current to the transistor 16 through the switch 70, the diodes 60 and 62, the resistor 58, the base electrode 52 of transistor 16, the P type region 46, the junction 43, the N type region 42, the emitter electrode 48, the conducting transistors 14 and 12 and the emitter terminal E back to the source. This flow of the base current causes the transistor 16 to be conductive. Therefore, the collector terminal C connected to the base electrode 52 of the transistor 16 is electrically connected to the emitter terminal E through the conducting transistors 16, 14 and 12. In other words, the transistor switch device 10 is closed to conduct a load current from the power source 64 to the load 66.

In order that the voltage across the transistor switch device 10 or the combination of the serially connected transistors 16, 14 and 12 due to the load current flowing therethrough will be as low as possible, all the transistors are preferably highly conductive. For this reason, the control current from the auxiliary or control source 68 for rendering first the transistor 12 conductive has such a magnitude that it will cause that transistor to be highly conductive. Similarly, the base currents flowing through the transistors 14 and 16 respectively have their respective magnitudes sufficient to cause the same to be highly conductive respectively. This can be readily accomplished by suitably selecting the values of the resistors and the voltage of the auxiliary source in accordance with the characteristics of the transistors used.

In order to compensate for a decrease in the base current through the transistor 14 resulting from the circuit associated with the base-to-emitter circuit thereof, the resistor 56 has a value of resistance less than that of the resistor 54. For the same reason, the resistor 58 has a value of resistance less than that of the resistor 56. Therefore, the resistor 58 has the lowest value of resistance while the resistor 54 has the highest value with the resistor 56 having an intermediate value.

If it is desired to deenergize the load 66, the switch 70 can be opened. The opening of the switch 70 causes the simultaneous interruption of the base currents flowing through the transistors 12, 14 and 16 to thereby bring the same into nonconductive state simultaneously. This disconnects electrically the collector terminal C from the emitter terminal E of the transistor switch device 10. At the same time, the full voltage V from the power source 64 tends to be applied across the collector and emitter terminals C and E respectively. Since the load includes generally an inductive component the interruption of the load current will induce a transient voltage of high amplitude in the load circuit. In addition to the full voltage from the power source 64, that transient voltage, therefore, will be cumulatively impressed across the transistor switch device 10 at the instant the same is caused to be nonconductive. These voltages tend to maintain the device conductive but may destroy the same.

With the transistors 12, 14 and 16 having substantially similar characteristics, the breaking voltage V appearing across the collector and emitter electrodes C and E respectively of the transistor switch device 10 will be substantially equally distributed among the transistors. Therefore, the breaking voltage substantially divided by three is impressed on each of the transistors and more particularly on each of the junctions 45, 33 and 21 respectively in the transistors 16, 14 and 12.

Therefore, insofar as the one-third of the breaking voltage is less than the Zener voltage inherent in the abovementioned junctions, the transistor switch device comprising the three transistors 12, 14 and 16 can interrupt the load current with a low leakage current permitted to flow through the same.

If neither of the semiconductor diodes 62 and 60 would be connected in the base circuits of the associated transistors then the circuit from the collector terminal C through the portions 50, 45, 44, 46, 52 of the transistor 16, the resistors 58 and 54 and the portions 28, 22, 19, 18, 24 of the transistor 12 to the emitter terminal E will include only a single junction in blocking state or the junction 45 formed between the N type region 44 and the P type region 46 of the transistor 16. Upon blocking the transistor switch device without the semiconductor diodes 62 and 60, therefore, the breaking voltage appearing across the collector and emitter terminals thereof will be essentially impressed on the abovementioned junction 45 of the transistor 16 which, in turn may be broken down.

In order to overcome this serious disadvantage, the invention comprises the use of a semiconductor diode such as 62 or 60 connected in the associated base circuit of the transistor. As previously explained, each of the diodes 60 and 62 permits a current to flow from the base terminal B therethrough to the base electrode of the associated transistor but prevents the flow of current from that base electrode therethrough to the base terminal. Therefore, the breaking voltage appearing across the collector and emitter terminals C and E respectively of the transistor switch device 10 upon blocking the same will be also shared with the transistor 16, the diode 62 and the diode 60. That voltage may be further shared with the transistor 16, the transistor 14 and the diode 60. Accordingly, the breaking voltage is prevented from being shared with a single transistor.

It will be understood that the transistor switch device 10 performs an operation resembling that of a single transistor having an emitter terminal E, a collector terminal C and a base terminal B and operable to interrupt a high voltage current with a low leakage current permitted to flow therethrough.

Referring now to FIG. 2 of the drawings, there is illustrated another embodiment of the invention. In FIGS. 1 and 2, the same reference numerals designate the like parts. The connections with the transistor switch device 10 shown in FIG. 2 is similar to that of FIG. 1 except that a semiconductor diode is connected in series with the base resistor of each transistor between the base electrode of the respective transistor and a common control line A connected to the base terminal B of the switch device 10. More particularly, the semiconductor diode 72 is connected serially to a base resistor 54 in the base circuit of transistor 12, a semiconductor diode 74 is connected serially to the base resistor 56 in the base circuit of transistor 14 and the semiconductor diode 76 is connected serially to a base resistor 58 in the base circuit of transistor 16. The sides of the diodes 72, 74 and 76 remote from the associated resistors are connected through the common control line A to the base terminal B of the switch device 10. As in the transistor device shown in FIG. 1, each of the semiconductor diodes 72, 74 and 76 serves to prevent a current from flowing from the collector terminal C through the base circuit of the associated transistor and the particular diode to the emitter terminal E.

Due to the different arrangement of the semiconductor diodes, the transistor switch device shown in FIG. 2 can prevent a leakage current from flowing through the same in the reverse direction or from flowing from the emitter terminal E through any one of the base circuits of the transistors 12, 14 and 16 to the collector terminal C. As a result the device is particularly suitable for use with the load 66 either adapted to be energized by a source of alternating current 64 or including an oscillating network, that is to say, with a circuit whose terminals such as C and E are energized with a voltage having a varying polarity. For this reason the device shown in FIG. 2 is preferably used with a circuit including a capacitor for absorbing a high transient voltage occurring in the same due to the high inductance of the load upon opening the circuit.

While the invention has been described in conjunction with a transistor switch device comprising three transistors connected in series circuit relationship to each other it is to be understood that any desired number of serially connected transistors may be used in accordance with the magnitude of the breaking voltage appearing across the terminals of the device upon blocking the same.

From the foregoing it is apparent that the invention has provided a transistor switch device with an emitter terminal, a collector terminal and a base terminal comprising a plurality of serially connected transistors and capable of interrupting a high voltage current as in the case of a single imaginary transistor having a high breaking voltage and a very low leakage current when the same is blocked.

While the invention has been described in conjunction with the preferred embodiments thereof it is to be understood that various modifications and changes may be made without departing from the spirit and scope of the invention. For example, the resistors 54, 56 and 58 may be omitted particularly when a small number of transistors is used.

What I claim is:

1. A transistor switch device having opposite terminals and comprising a plurality of transistors connected in series cascade between said terminals, each transistor having an emitter electrode, a collector electrode and a base electrode, the emitter electrode of the first transistor in the series being connected to one said terminal and the collector electrode of the last transistor in the series being connected to the other said terminal, means for connecting a source of electric power to be switched and a load in series across said terminals, and a common base circuit for controlling all of said transistors, said common base control circuit comprising means for supplying direct current for controlling said transistors, a control switch, a common control line, means connecting said control current supply means and said control switch in series between said common control line and one of said terminals with said control current supply means connected in a direction to supply base current to said transistors to make them conductive, means including a resistor connecting the base electrode of each of said transistors to said common control line to provide a connecting circuit between the base electrodes of successive transistors in the series, and at least one semiconductive diode in each said connecting circuit between the base electrodes of successive transistors in the series to permit the supply of control current to each base electrode but to block the flow of current in the opposite direction, whereby said transistors act together as a single transistor to conduct current through the circuit containing said power source and load when said control current supply means is connected and to block the load current when said control current supply means is disconnected and whereby the voltage in said blocking condition is divided among said transistors to avoid subjecting an individual transistor to excessive voltage.

2. A transistor switch device according to claim 1, in which each said semiconductive diode is connected in said common control line between said means respectively connecting the base electrodes of successive transistors to said common control line.

3. A transistor switch device according to claim 1, in which each said semiconductive diode is connected in series with the respective said resistor in said means connecting the base electrode of each transistor to said common control line.

4. A transistor switch device comprising a first, a second and a third transistor each including an emitter, a base and a collector electrode, said collector electrode of said first transistor being connected to the emitter electrode of said second transistor and said collector electrode of said second transistor being connected to the emitter electrode of said third transistor, a source of electric power and a load connected in series circuit relationship across the emitter electrode of said first transistor and the collector electrode of said third transistor, a base circuit comprising a first resistance, a first semiconductor diode and a second resistance connected in series between the base electrode of said first transistor and the base electrode of said second transistor and said second resistance, a second semiconductor diode and a third resistance connected in series between the base electrode of said second transistor and the base electrode of said third transistor, a supply of control current having two electrodes, means for connecting said electrodes respectively to the emitter electrode of said first transistor and to said base circuit between said first resistance and said first diode, and means for disconnecting said supply of control current whereby said transistors act together as a single transistor to conduct current through the circuit containing said power source and load when said control current supply is connected and to block the load current when said control current supply is disconnected and whereby the voltage in said blocking condition is divided among said transistors to avoid subjecting an individual transistor to excessive voltage.

5. A transistor switch device according to claim 4, in which said first resistance has a higher value than said second resistance and said second resistance has a higher value than said third resistance.

6. A transistor switch device comprising a first, a second and a third transistor each including an emitter, a base and a collector electrode, said collector electrode of said first transistor being connected to the emitter electrode of said second transistor and said collector electrode of said second transistor being connected to the emitter electrode of said third transistor, a source of electric power and a load connected in series circuit relationship across the emitter electrode of said first transistor and the collector electrode of said third transistor and a control circuit comprising a supply of control current having two terminals, means for connecting one terminal of said control current supply to the emitter electrode of said first transistor, means for connecting the other of said terminals of said control current supply to the base electrodes of said transistors respectively through three parallel branches each comprising a resistance and a semiconductor diode and means for disconnecting said control current supply, whereby said transistors act together as a single transistor to conduct current through the circuit containing said power source and load when said control current supply is connected and to block the load current when said control current supply is disconnected and whereby the voltage in said blocking condition is divided among said transistors to avoid subjecting an individual transistor to excessive voltage.

7. A transistor switch device according to claim 6, in which said first resistance has a higher value than said second resistance and said second resistance has a higher value than said third resistance.

References Cited by the Examiner

UNITED STATES PATENTS

| | | | |
|---|---|---|---|
| 2,835,829 | 5/1958 | Sourgens et al. | 307—88.5 |
| 2,885,572 | 5/1959 | Felker | 307—88.5 |
| 2,952,785 | 9/1960 | Hodder | 307—88.5 |
| 3,067,338 | 12/1962 | Baude | 307—88.5 |
| 3,160,807 | 12/1964 | Packard | 307—88.5 |
| 3,167,705 | 1/1965 | Sohner | 315—209 |

FOREIGN PATENTS

| | | |
|---|---|---|
| 1,096,417 | 1/1961 | Germany. |

ARTHUR GAUSS, *Primary Examiner.*

ROY LAKE, JOHN W. HUCKERT, *Examiners.*

R. H. EPSTEIN, *Assistant Examiner.*